(12) United States Patent
Yamamoto et al.

(10) Patent No.: US 7,099,185 B2
(45) Date of Patent: Aug. 29, 2006

(54) MAGNETIC MEMORY ARRAY, METHOD FOR RECORDING IN A MAGNETIC MEMORY ARRAY AND METHOD FOR READING OUT FROM A MAGNETIC MEMORY ARRAY

(75) Inventors: Masahiko Yamamoto, Minoo (JP); Ryoichi Nakatani, Toyonaka (JP); Yasushi Endo, Toyonaka (JP)

(73) Assignee: Osaka University, Suita (JP)

( * ) Notice: Subject to any disclaimer, the term of this patent is extended or adjusted under 35 U.S.C. 154(b) by 294 days.

(21) Appl. No.: 10/724,207

(22) Filed: Dec. 1, 2003

(65) Prior Publication Data

US 2004/0165426 A1 Aug. 26, 2004

(30) Foreign Application Priority Data

Dec. 13, 2002 (JP) ............................ 2002-362200

(51) Int. Cl.
*G11C 11/00* (2006.01)

(52) U.S. Cl. ..................... 365/158; 365/171; 365/173

(58) Field of Classification Search ............... 365/158, 365/171

See application file for complete search history.

(56) References Cited

U.S. PATENT DOCUMENTS

| 5,475,304 | A | | 12/1995 | Prinz | |
|---|---|---|---|---|---|
| 5,923,583 | A | * | 7/1999 | Womack | ..................... 365/171 |
| 6,166,948 | A | * | 12/2000 | Parkin et al. | ............... 365/173 |
| 6,351,410 | B1 | | 2/2002 | Nakao et al. | |
| 6,391,483 | B1 | | 5/2002 | Zhu et al. | |
| 6,577,526 | B1 | * | 6/2003 | Schwarzl | .................... 365/158 |
| 6,950,332 | B1 | * | 9/2005 | Yamamoto et al. | ......... 365/158 |
| 2003/0107849 | A1 | | 6/2003 | Ikarashi | |

FOREIGN PATENT DOCUMENTS

| JP | A 9-509775 | 9/1997 |
|---|---|---|
| JP | A 11-154389 | 6/1999 |
| JP | A 11-273337 | 10/1999 |
| JP | A 11-353867 | 12/1999 |
| JP | A 2001-084758 | 3/2001 |
| JP | A 2002-73681 | 3/2002 |
| JP | A 2002-231904 | 8/2002 |
| JP | A 2002-280637 | 9/2002 |
| JP | A 2003-273331 | 9/2003 |
| WO | WO 95/10112 | 4/1995 |
| WO | WO 00/58970 | 10/2000 |
| WO | WO 03/032336 A1 | 4/2003 |

OTHER PUBLICATIONS

Cowburn et al. "Single-Domain Circular Nanomagnets," The American Physical Society, Physical Review Letters, vol. 83, No. 5, Aug. 2, 1999, pp. 1042-1045.
Zhu et al. "Ultrahigh Density Vertical Magnetoresistive Random Access Memory (INVITED)," Symposium on Magnetic Technology for a Single Chip Computer, Journal of Applied Physics, vol. 87, No. 9, May 1, 2000, pp. 6668-6673.
Li et al. "Flux Closure Structures in Cobalt Rings," The American Physical Society, Physical Review Letters, vol. 86, No. 6, Feb. 5, 2001, pp. 1102-1105.

(Continued)

*Primary Examiner*—Son T. Dinh
(74) *Attorney, Agent, or Firm*—Oliff & Berridge, PLC

(57) ABSTRACT

A plurality of magnetic memories with respective ring-shaped magnetic layers therein are prepared. The magnetic layers have respective notches formed by partially cutting out the peripheries thereof in circular arc shape. The magnetic memories are arranged in plane so that the surfaces of the notches are parallel to one another.

24 Claims, 4 Drawing Sheets

OTHER PUBLICATIONS

Kläui et al. "Vortex Circulation Control in Mesoscopic Ring Magnets," American Institute of Physics, Applied Physics Letters, vol. 78, No. 21, May 21, 2001, pp. 3268-3270.

Schneider et al. "Magnetic Switching of Single Vortex Permalloy Elements," American Institute of Physics, Applied Physics Letters, vol. 79, No. 19, Nov. 5, 2001, pp. 3113-3115.

M. Schneider et al. "Magnetic Switching of Single Vortex Permalloy Elements", Applied Physics Letters, vol. 79, No. 19, pp. 3113-3115 (2001).

Ryoichi Nakatani et al., "Shape of Magnetic Ring Dot Array Manufactured by Fine Process and the Magnetic Domain Structure", The Japan Institute of Metals Lecture Summary, Sep. 22, 2001, p. 367.

Ryoichi Nakatani et al., Manufacturing of Co-Pt Ring Dot Array for Magnetic Memory, The 25th Magnetic Society of Japan Study Lecture Summary, Sep. 25, 2001 p. 247.

* cited by examiner

Direction of magnetization 「0」

Direction of magnetization 「1」

Direction of magnetization

Direction of magnetization

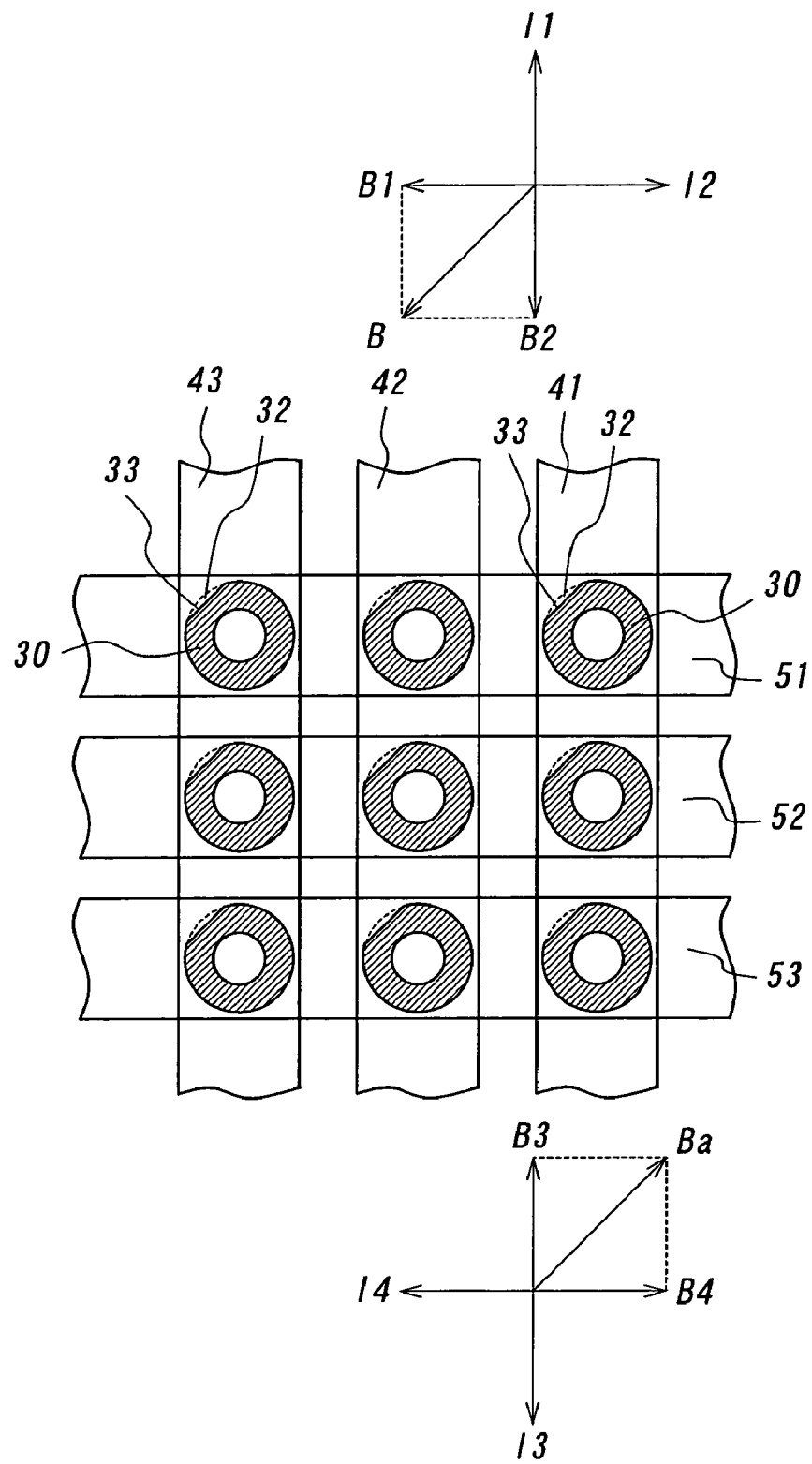

MAGNETIC MEMORY ARRAY, METHOD FOR RECORDING IN A MAGNETIC MEMORY ARRAY AND METHOD FOR READING OUT FROM A MAGNETIC MEMORY ARRAY

BACKGROUND OF THE INVENTION

1. Field of the Invention

This invention relates to a nonvolatile magnetic memory array which is preferably usable as a magnetic random access memory (MRAM). Also, this invention relates to a method for recording in the nonvolatile magnetic memory array and a method for reading out from the nonvolatile magnetic memory array.

2. Description of the Prior Art

Various electronic devices have been employed under a specific condition such as an aero-space, and thus, it is desired to establish a recording device where once stored information can not be deleted by the irradiation of a radioactive ray. In this point of view, large radioactive-resistance and nonvolatile MRAMs having their respective simply structured magnetic memory cells are researched and developed.

Conventionally, such a magnetic memory cell is shaped rectangular, and information "0" or "1" is stored on the magnetic direction of the magnetic memory cell. With the conventional magnetic memory cell, however, the magnetic flux originated from the magnetization is leaked outside from the magnetic memory cell due to the configuration thereof. In order to increase the recording capacity of the MRAM, in contrast, such an attempt is made as to arrange a plurality of magnetic memory cells in high density. In this case, however, the leaked magnetic flux affects significantly on the adjacent magnetic memory cells, and thus, the intended high density MRAM can not be realized.

In this point of view, the inventors have developed a ring-shaped magnetic memory where a right handed (clockwise) magnetization or a left-handed (anticlockwise) magnetization is created in vortex, and information "0" or "1" is stored on the rotative direction of the magnetization thereof (Japanese Patent application 2002-73681).

In this case, since a magnetic flux is not leaked from the magnetic memory, if a plurality of magnetic memories are arranged in high density as mentioned above, the leaked magnetic flux can not almost affect on the adjacent magnetic memories, so that a high density MRAM can be realized.

As the thickness of the magnetic layer of the magnetic memory to store information is decreased, however, the vortex magnetization can not be created and thus, it may be that information recording utilizing the vortex magnetization can not be realized ([Physical Review Letters, 83, No. 5, pp1042–1045 (1999)].

SUMMERY OF THE INVENTION

It is an object of the present invention to provide a magnetic memory array which can create a vortex magnetization, irrespective of the thickness of the magnetic layer of the magnetic memory composing the magnetic memory array. It is another object of the present invention to provide a recording method and a reading method for the magnetic memory array.

In order to achieve the above-mentioned objects, this invention relates to a magnetic memory array comprising a plurality of magnetic memories with respective ring-shaped magnetic layers therein, the magnetic layers having respective notches formed by partially cutting out peripheries thereof in circular arc shape,
the magnetic memories being arranged in plane so that surfaces of the notches are parallel to one another.

The inventors found out through vast researches and developments that if the periphery of the ring-shaped magnetic layer composing the magnetic memory is partially cut so that the resultant cross sectional surface is perpendicular to the radial direction of the magnetic memory, the clockwise magnetization and the anticlockwise magnetization can be easily created in vortex even though the thickness of the magnetic layer is small. Then, if such a plurality of magnetic memories are arranged so that the cut lines of the notches of the magnetic layers are almost parallel to one another, to form a magnetic memory array, the recording operation for the magnetic memory array can be performed by applying a uniform external magnetic field. As a result, the magnetic memory array can be utilized as a high density recording medium.

According to the present invention, therefore, even though the thickness of the magnetic layer of each magnetic layer composing the magnetic memory array is reduced within 1–10 nm, the vortex magnetization can be easily created in the magnetic layer, and information "0" or "1" can be recorded in the magnetic layer on the rotative direction of the vortex magnetization.

In the present invention, since a magnetic flux is not leaked from the magnetic layer due to the vortex magnetization, even though a plurality of magnetic memories having their respective magnetic layers are arranged in high density to form the magnetic memory array, no leaked magnetic flux affects on the adjacent magnetic memories.

Other features and advantages of the magnetic memory array of the present invention will be described below. Also, a recording method and a reading method for the magnetic memory array will be described below.

BRIEF DESCRIPTION OF THE DRAWINGS

For better understanding of the present invention, reference is made to the attached drawings, wherein FIG. 5 is a plan view showing a magnetic memory array according to the present invention.

DESCRIPTION OF THE PREFERRED EMBODIMENTS

This invention will be described in detail with reference to the accompanying drawings.

Figure 1:
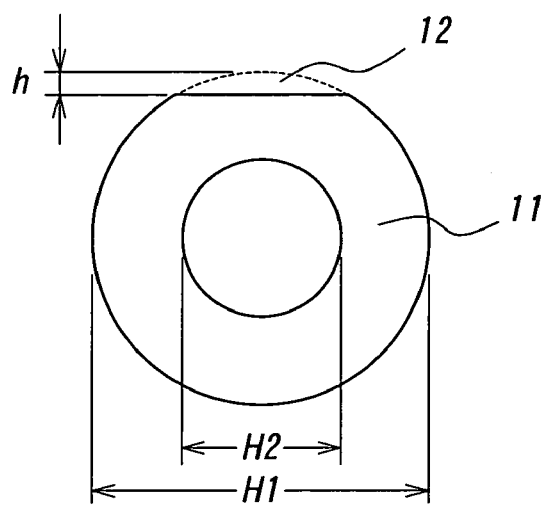
FIG. 1 is a plan view schematically showing the configuration of a magnetic layer of a magnetic memory composing a magnetic memory array according to the present invention, FIGS. 2(*a*)–(*d*) are plan views showing the magnetization states of the magnetic layer shown in FIG. 1.

FIG. 1 is a schematic view showing the configuration of a magnetic layer of a magnetic memory composing a magnetic memory array according to the present invention, and FIGS. 2(*a*)–(*c*) are plan views showing the magnetization states of the magnetic layer shown in FIG. 1.

As shown in FIG. 1, the magnetic layer 11 is shaped in ring, and the periphery of the magnetic layer 11 is partially cut out so that the resultant cross sectional surface is perpendicular to the radial direction of the magnetic layer 11. As a result, a circular arc notch is formed at the periphery of the magnetic layer 11. With the ring-shaped magnetic layer 11 having the notch 12, even though the thickness of the magnetic layer 11 is reduced within 1–10 nm, for example, a vortex magnetization of right-handed (clockwise) direction or left-handed (anticlockwise) direction can be created in the magnetic layer 12 as shown in FIGS. 2(a) and 2(b).

As shown in FIG. 2, therefore, if the right-handed (clockwise) magnetization is allotted to information "0" and the left-handed (anticlockwise) magnetization is allotted to information "1", recording operation can be performed for the magnetic layer 11.

Figure 2A:
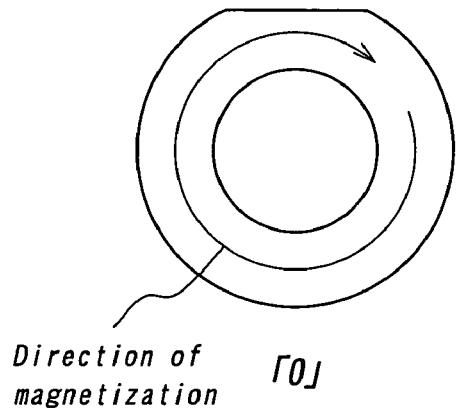
Figure 2B:
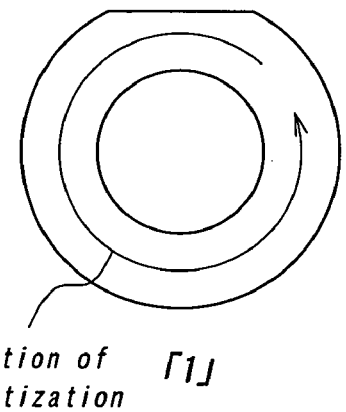
Figure 2C:
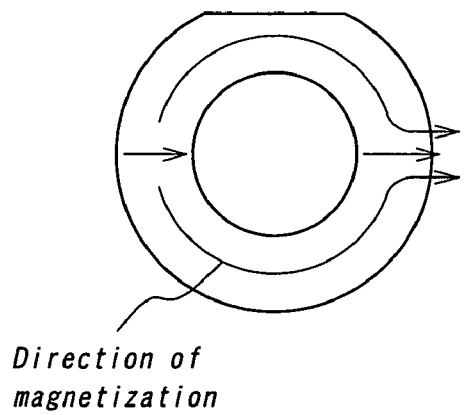
Figure 2D:
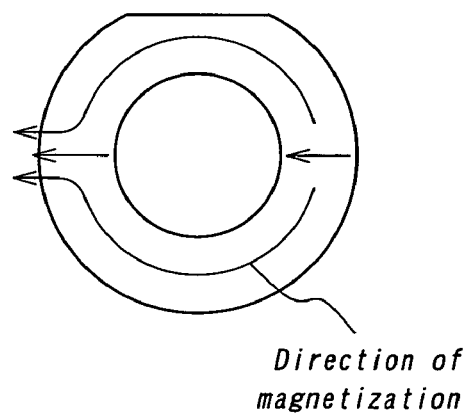

In the recording operation, the magnetization of the magnetic layer 11 is varied in FIG. 2(b) from FIG. 2(a) via FIG. 2(c) or in FIG. 2(a) from FIG. 2(b) via FIG. 2(d).

If the height of the notch 12 is defined as "h" and the outer diameter of the ring-shaped magnetic layer 11 is defined as "H1", the ratio (h/H1) is preferably set to 0.01 or over, particularly 0.05 or over. Therefore, if the notch 12 is formed by cutting the periphery of the magnetic layer 11 so as to satisfy the above-mentioned relation, the recording operation for the magnetic memory array of the present invention can be performed easily and precisely by a smaller external magnetic field.

Although the upper limited value of the ratio (h/H1) is not restricted, it may be preferably set to 0.2. If the ratio (h/H1) is set over the upper limited value of 0.2, the effect/function of the present invention can not be enhanced, and it may be that a vortex magnetization can not be created in the magnetic layer 11 to be not able to be employed in the magnetic memory.

In order to maintain the ring shape of the magnetic layer 11, it is required to satisfy the relation of "h<(H1−H2)/2 if the inner diameter of the magnetic layer 11 is defined as "H2".

The magnetic layer 11 may be made of a room temperature ferromagnetic material such as Ni—Fe, Ni—Fe—Co or Co—Fe, for example. The "room temperature ferromagnetic material" means a magnetic material showing ferromagnetic property at room temperature. Therefore, other magnetic materials may be employed, instead of the above-mentioned ferromagnetic material such as Ni—Fe or the like.

The thickness of the magnetic layer 11 is preferably set within 1–10 nm, particularly within 3–5 nm. In this case, a sufficiently large vortex magnetization can be created in the magnetic layer 11, and thus, information can be stably stored when information "0" or "1" is allotted to the rotative direction of the vortex magnetization.

Figure 3:
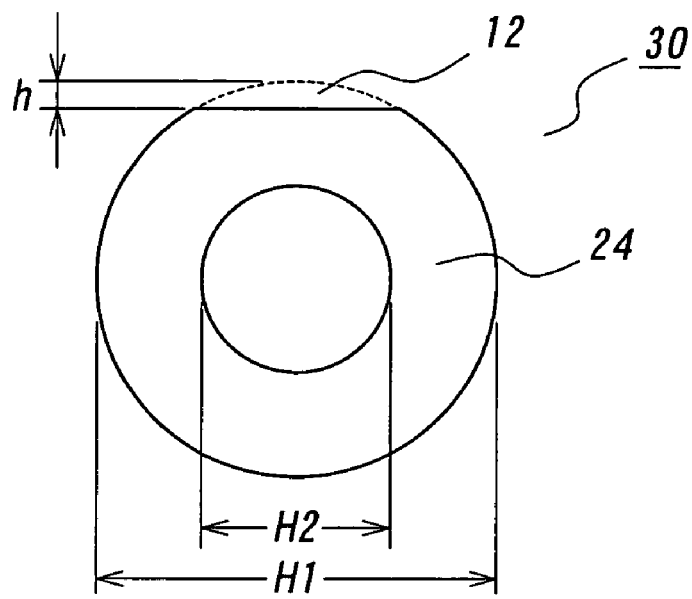
FIG. 3 is a plan view showing a concrete embodiment of the magnetic memory.
Figure 4:
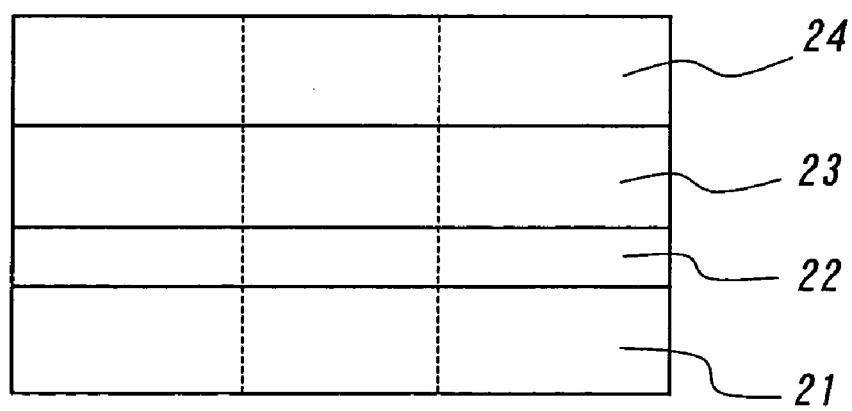
FIG. 4 is a side view of the magnetic memory shown in FIG. 3.

FIG. 3 is a plan view showing a concrete embodiment of the magnetic memory shown in FIG. 1, and FIG. 4 is a side view of the magnetic memory shown in FIG. 3. In the magnetic memory 30 shown in FIGS. 3 and 4, on a magnetic layer 21 as shown in FIG. 1 are successively formed an additional magnetic layer 23 and an antiferromagnetic layer 24 via a non-magnetic layer 22. The magnetic layer 21 is shaped in ring, and the periphery of the magnetic layer 21 is partially cut out so as to form a notch thereat. The non-magnetic layer 22 through the antiferromagnetic layer 24 are also shaped in ring, which are concentrically for the magnetic layer 21.

In this embodiment, the peripheries of the non-magnetic layer 22 through the antiferromagnetic layer 24 are cut out to form the same notches as the one of the magnetic layer 21 thereat. The notches of the magnetic layer 21 through the antiferromagnetic layer 24 satisfy the above-mentioned relation relating to the notch of the magnetic layer 11.

The magnetic layer 21 is magnetized in right-handed (clockwise) direction or left-handed (anticlockwise) direction, and information "0" or "1" is allotted to the rotative direction of the resultant vortex magnetization. In this way, recording operation for the magnetic memory is performed.

In the magnetic memory 30 shown in FIG. 3, the additional magnetic layer 23 is magnetized in right-handed (clockwise) direction or left-handed (anticlockwise) direction in advance, and the resultant vortex magnetization of the additional magnetic layer 23 is pinned through the bond with exchanging interaction to the antiferromagnetic layer 24. The magnetic layer 21 and the additional magnetic layer 23 are magnetically divided by the non-magnetic layer 22.

The magnetic layer 21 may be made of a room temperature ferromagnetic material as mentioned above, and the thickness of the magnetic layer 21 may be set within 1–10 nm. The additional magnetic layer 23 may be made of such a room temperature ferromagnetic material as mentioned above, and the thickness of the additional magnetic layer 23 may be set within 1–10 nm.

The non-magnetic layer 22 may be made of a non-magnetic material such as Cu, Ag or Au, and the antiferromagnetic layer 24 may be made of an antiferromagnetic material such as Mn—Ir, Mn—Pt or Fe—Mn. The thickness of the non-magnetic layer 22 is set so as to magnetically divide the magnetic layer 21 and the additional magnetic layer 23. The thickness of the antiferromagnetic layer 24 is set so as to magnetically pin the magnetization of the additional magnetic layer 23 through the bond with exchanging interaction.

FIG. 5 is a plan view showing a magnetic memory array according to the present invention. In the magnetic memory array shown in FIG. 5, a plurality of magnetic memories 30 shown in FIGS. 3 and 4 are arranged in 3×3 so that the surfaces of the notches 32 are directed upper left and almost parallel to one another. On the top and the bottom of the magnetic memory array are arranged top conducting wires 41–43 and bottom conducting wires 51–53 for the recording operation and the reading operation for the magnetic memory array.

Although in this embodiment, the nine magnetic memories 30 are arranged, the arrangement number of the magnetic memory 30 is not restricted, but any arrangement number will do on the use of the magnetic memory array. Moreover, although in this embodiment, the magnetic memories 30 are arranged in 3×3, the arrangement configuration of the magnetic memory 30 is not restricted, but any arrangement configuration will do on the use of the magnetic memory array.

In the recording operation for the magnetic memory array shown in FIG. 5, currents are flowed in the top conducting wires and the bottom conducting wires of the magnetic memory 30 to be recorded to generate a magnetic field around the magnetic memory 30. Then, the magnetic memory 30 is recorded by the magnetic field. When the recording operation is carried out for the upper right magnetic memory 30, a current I1 is flowed upward in the top conducting wire 41 and a current I2 is flowed right in the bottom conducting wire 51. In this case, the synthetic magnetic field B from the inductive magnetic field B1 due to the upward current I1 and the inductive magnetic field B2 due to the right current I2 is generated to create a left-handed (anticlockwise) magnetization as shown in FIG. 2(b) in the magnetic layer 21. Therefore, the recording operation for the magnetic memory 30 can be performed by allotting information "0" or "1" to the left-handed (anticlockwise) magnetization.

It is desired to direct the synthetic magnetic field B in parallel with the surface 33 of the notch 32 of the magnetic memory 30 to be recorded. In this case, the recording operation for the magnetic memory 30 can be performed easily and precisely by a smaller magnetic field. In order to satisfy this requirement, the currents I1 and I2 and the position of the magnetic memory 30 are controlled appropriately.

When a current I3 is flowed downward in the top conducting wire 41 and a current I4 is flowed left in the bottom conducting wire 51, another synthetic magnetic field Ba, which is opposite to the synthetic magnetic field B and generated from the currents I3 and I4, is applied to the magnetic memory 30 to create a right-handed (anticlockwise) magnetization as shown in FIG. 2(2) in the magnetic layer 21.

In this case, too, it is desired to direct the synthetic magnetic field Ba in parallel with the surface 33 of the notch 32 of the magnetic memory 30 to be recorded.

The recording operation for another magnetic memory 30 can be performed in the same manner as the upper right magnetic memory 30. For example, when the current I1 is flowed upward in the top conducting wire 42 and the current I2 is flowed right in the bottom conducting wire 52, the center magnetic memory 30 is recorded by the synthetic magnetic field B generated from the currents I1 and I2 to create a right-handed (clockwise) magnetization as shown in FIG. 2(a) in the magnetic layer 21.

The recording operation can be performed at every magnetic memory 30, but can be at some magnetic memories 30.

The reading operation for the magnetic memory array shown in FIG. 5 can be performed by utilizing the change in electric resistance of the magnetic memory 30 recorded on the relative direction in magnetization between the additional magnetic layer 23 and the magnetic layer 21. In this case, the magnetization of the additional magnetic layer 23 is pinned by the antiferromagnetic layer 24 through the bond with exchange interaction. For example, when the magnetization of the magnetic layer 21 is parallel to the magnetization of the additional magnetic layer 23, the electric resistance of the magnetic memory 30 is decreased. When the magnetization of the magnetic layer 21 is anti-parallel to the magnetization of the additional magnetic layer 23, the electric resistance of the magnetic memory 30 is increased.

Therefore, since the current of the magnetic memory 30 is varied on the change in electric resistance due to the relative direction in magnetization, as mentioned above, if the direction of the magnetization of the additional magnetic layer 23 is fixed, the direction of the magnetization of the magnetic layer 21 can be known, so that information "0" or "1" allotted to the direction of the magnetization of the magnetic layer 21 can be read out.

With the magnetic memory array shown in FIG. 5, the information "0" or "1" recorded in the magnetic memory 30 can be read out by applying voltages to the corresponding top conducting wire and the corresponding bottom conducting wire and measuring the current from the magnetic memory 30. For example, when the reading operation is carried out for the upper right magnetic memory 30, voltages are applied to the top conducing wire 41 and the bottom conducting wire 51 to measure a current from the magnetic memory 30 through the conducting wires 41 and 51.

Although the present invention was described in detail with reference to the above examples, this invention is not limited to the above disclosure and every kind of variation and modification may be made without departing from the scope of the present invention.

As mentioned above, according to the present invention can be provided a magnetic memory array which can create a vortex magnetization, irrespective of the thickness of the magnetic layer of the magnetic memory composing the magnetic memory array. In addition, according to the present invention can be provided the recording method and the reading method for the magnetic memory array.

What is claimed is:

1. A magnetic memory array comprising a plurality of magnetic memories with respective ring-shaped magnetic layers therein,
    said magnetic layers having respective notches formed by partially cutting out peripheries thereof in circular arc shape,
    said magnetic memories being arranged in plane so that surfaces of said notches are parallel to one another.

2. The magnetic memory array as defined in claim 1, wherein said surfaces of said notches are set in parallel with a direction of an external magnetic field for recording.

3. The magnetic memory array as defined in claim 2, wherein a right-handed (clockwise) or a left-handed (anticlockwise) longitudinal magnetization is created in at least one of said magnetic layer by said external magnetic field.

4. The magnetic memory array as defined in claim 1, wherein if the height of each notch is defined as "h" and the outer diameter of each magnetic layer is defined as "H1", ratio (h/H1) is set to 0.01 or over.

5. The magnetic memory array as defined in claim 1, wherein each magnetic layer is made of room temperature ferromagnetic material.

6. The magnetic memory array as defined in claim 1, wherein the thickness of each magnetic layer is set within 1–10 nm.

7. The magnetic memory array as defined in claim 1, wherein each magnetic memory comprises an additional magnetic layer on each magnetic layer via an non-magnetic layer.

8. The magnetic memory array as defined in claim 7, wherein said additional magnetic layer is made of room temperature ferromagnetic material.

9. The magnetic memory array as defined in claim 7, wherein the thickness of said additional magnetic layer is set within 1–10 nm.

10. The magnetic memory array as defined in claim 7, wherein each magnetic memory comprises an antiferromagnetic layer which is formed adjacent to a main surface of said additional magnetic layer opposite to said each magnetic layer.

11. The magnetic memory array as defined in claim 7, wherein in said each magnetic memory, said additional magnetic layer is magnetized right handedly (clockwise) or left handedly (anticlockwise) along a ring-shaped surface thereof.

12. The magnetic memory array as defined in claim 10, wherein the direction of magnetization in said additional magnetic layer is pinned.

13. A method for recording in a magnetic memory array, comprising the steps of:
    preparing a plurality of magnetic memories with respective ring-shaped magnetic layers,
    partially cutting out peripheries of said magnetic layers in circular arc shape to form respective notches therein, arranging said magnetic memories so that surfaces of said notches are parallel to one another to form a magnetic memory array, and applying an external magnetic field to said magnetic memory array to perform a recording operation for said magnetic memory array.

14. The recording method as defined in claim 13, wherein said external magnetic field is applied so as to be parallel to said surfaces of said notches.

15. The recording method as defined in claim 13, wherein a right-handed (clockwise) or a left-handed (anticlockwise) longitudinal magnetization is created in at least one of said magnetic memories.

16. The recording method as defined in claim 13, wherein if the height of each notch is defined as "h" and the outer diameter of each magnetic layer is defined as "H1", ratio (h/H1) is set to 0.01 or over.

17. The recording method as defined in claim 13, wherein said magnetic layers are made of room ferromagnetic material.

18. The recording method as defined in claim 13, wherein the thickness of each magnetic layer is set within 1–10 nm.

19. A method for reading out from a magnetic memory array, comprising the steps of:

preparing a plurality of magnetic memories with respective ring-shaped magnetic layers, partially cutting out peripheries of said magnetic layers in circular arc shape to form respective notches therein, forming ring-shaped additional magnetic layers on said magnetic layers via non-magnetic layers, respectively, arranging said magnetic memories so that surfaces of said notches are parallel to one another to form a magnetic memory array, and applying an external magnetic field to said magnetic memory array to perform a recording operation for said magnetic memory array and create a right-handed (clockwise) or a left-handed (anticlockwise) magnetization in at least one of said magnetic memories, allotting information "0" or "1" to said right-handed (clockwise) or said left-handed (anticlockwise) magnetization, and reading out said information "0" or "1" on the change in electric resistance of said at least one of said magnetic memories due to the relative direction in magnetization between said magnetic layer and said additional magnetic layer thereof.

20. The reading out method as defined in claim 19, further comprising the step of forming antiferromagnetic layers which are adjacent to main surfaces of said additional magnetic layers opposite to said magnetic layers to fix magnetizations of said additional magnetic layers, respectively.

21. The reading out method as defined in claim 19, wherein if the height of each notch is defined as "h" and the outer diameter of each magnetic layer is defined as "H1", ratio (h/H1) is set to 0.01 or over.

22. The reading out method as defined in claim 19, wherein said magnetic layers are made of room ferromagnetic material.

23. The reading out method as defined in claim 19, wherein the thickness of each magnetic layer is set within 1–10 nm.

24. The reading out method as defined in claim 19, wherein the thickness of each additional magnetic layer is set within 1–10 nm.

\* \* \* \* \*

UNITED STATES PATENT AND TRADEMARK OFFICE
CERTIFICATE OF CORRECTION

| | | |
|---|---|---|
| PATENT NO. | : 7,099,185 B2 | Page 1 of 1 |
| APPLICATION NO. | : 10/724207 | |
| DATED | : August 29, 2006 | |
| INVENTOR(S) | : Yamamoto et al. | |

It is certified that error appears in the above-identified patent and that said Letters Patent is hereby corrected as shown below:

On the Title Page, in Item (58), under "Field of Classification Search", in Column 1, Line 2, delete "365/171" and insert -- 365/171, 173 --, therefor.

In the Specification:

In Column 1, Line 55, delete "SUMMERY" and insert -- SUMMARY --, therefor.

In Column 2, Line 55, delete "DESCRIPTION" and insert -- DETAILED DESCRIPTION --, therefor.

In Column 2, Line 63, delete "2(a)-(c)" and insert -- 2(a)-(d) --, therefor.

Signed and Sealed this
Fourth Day of June, 2013

Teresa Stanek Rea
*Acting Director of the United States Patent and Trademark Office*